United States Patent
Cao et al.

(10) Patent No.: US 9,257,084 B2
(45) Date of Patent: Feb. 9, 2016

(54) SHIFT REGISTER UNIT AND GATE DRIVER CIRCUIT

(71) Applicant: BOE TECHNOLOGY GROUP CO., LTD., Beijing (CN)

(72) Inventors: Kun Cao, Beijing (CN); Zhongyuan Wu, Beijing (CN); Liye Duan, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 56 days.

(21) Appl. No.: 14/366,534
(22) PCT Filed: Dec. 17, 2013
(86) PCT No.: PCT/CN2013/089615
§ 371 (c)(1),
(2) Date: Jun. 18, 2014
(87) PCT Pub. No.: WO2015/039393
PCT Pub. Date: Mar. 26, 2015

(65) Prior Publication Data
US 2015/0255031 A1 Sep. 10, 2015

(30) Foreign Application Priority Data
Sep. 22, 2013 (CN) .......................... 2013 1 0432095

(51) Int. Cl.
G09G 3/36 (2006.01)
G11C 19/28 (2006.01)

(52) U.S. Cl.
CPC .............. *G09G 3/3648* (2013.01); *G11C 19/28* (2013.01); *G09G 2310/0286* (2013.01); *G09G 2310/067* (2013.01)

(58) Field of Classification Search
CPC .............. G09G 3/3648; G09G 3/3677; G09G 2310/0283; G09G 2310/0267; G09G 2310/0278; G09G 2310/0281; G09G 2310/0286; G09G 2310/067; G11C 19/28; G11C 19/00

USPC ....................... 345/100, 204, 210; 377/64–81
See application file for complete search history.

(56) References Cited

U.S. PATENT DOCUMENTS 7,342,576 B2   3/2008   Chegal
7,738,622 B2   6/2010   Cho et al.
(Continued)

FOREIGN PATENT DOCUMENTS

CN   101556833 A   10/2009
CN   102650751 A   8/2012
(Continued)

OTHER PUBLICATIONS

English Translation of the International Search Report of PCT/CN2013/089615 published in English on Mar. 26, 2015.
(Continued)

*Primary Examiner* — Rodney Amadiz
(74) *Attorney, Agent, or Firm* — Collard & Roe, P.C.

(57) ABSTRACT

Provided are a shift register unit and a gate driver circuit, which are configured to suppress output errors caused by the drifts in the threshold voltages and the interval existed in the operation of pulling the output terminal, and thus to enhance stability of the shift register unit. The shift register unit comprises: an input module, a first output module, a pull-down driving module, a pull-down module and a first output discharging unit. The pull-down driving module is connected to the first clock signal input terminal and the second clock signal input terminal, and configured to provide the first clock signal to a first pull-down node in response to the first clock signal, provide the second clock signal to a second pull-down node in response to the second clock signal, provide a first low voltage signal to the first pull-down node and the second pull-down node in response to the voltage signal at the pull-up node, provide the first low voltage signal to the second pull-down node in response to a voltage signal at the first pull-down node, and provide the first low voltage signal to the first pull-down node in response to a voltage signal at the second pull-down node.

19 Claims, 5 Drawing Sheets

(56) References Cited

U.S. PATENT DOCUMENTS

| | | | | |
|---|---|---|---|---|
| 8,155,261 | B2* | 4/2012 | Hu | G11C 19/28 377/64 |
| 8,275,089 | B2* | 9/2012 | Hu | G09G 3/3677 377/64 |
| 9,123,283 | B2* | 9/2015 | Wang | G11C 19/28 |
| 2008/0036725 | A1 | 2/2008 | Lee et al. | |
| 2014/0086379 | A1 | 3/2014 | Ma et al. | |
| 2015/0131771 | A1* | 5/2015 | Hu | G09G 3/20 377/68 |

FOREIGN PATENT DOCUMENTS

| | | |
|---|---|---|
| CN | 102682699 A | 9/2012 |
| CN | 202502720 U | 10/2012 |
| CN | 102867543 A | 1/2013 |
| CN | 103151011 A | 6/2013 |
| CN | 103198781 A | 7/2013 |
| CN | 103226981 A | 7/2013 |
| CN | 103489484 B | 3/2015 |
| KR | 10-2005-0068608 A | 7/2005 |
| KR | 10-2007-0122174 A | 12/2007 |
| KR | 10-2008-0057601 A | 6/2008 |
| KR | 10-2013-0012392 A | 2/2013 |
| KR | 10-2013-0071438 A | 6/2013 |

OTHER PUBLICATIONS

International Search Report, International Preliminary Report on Patentability and Written Opinion of the International Searching Authority of PCT/CN2013/089615 in Chinese, mailed Dec. 17, 2013.

Chinese Office Action of Chinese Application No. 201310432095.X, mailed Jun. 19, 2014.

Notification to Grant the Patent Right (Notice of Allowance) for CN 201310432095.X, issued Feb. 6, 2015 in Chinese with English translation.

The Allowed Claims for CN 201310432095.X in Chinese with English Translation.

Chinese Office Action of Chinese Application No. 201310432095.X with English translation, mailed Oct. 31, 2014.

Korean Office Action of Korean Application No. 10-2014-7019948, mailed Apr. 21, 2015 with English translation.

* cited by examiner

SHIFT REGISTER UNIT AND GATE DRIVER CIRCUIT

CROSS REFERENCE TO RELATED APPLICATIONS

This application is the National Stage of PCT/CN2013/089615 filed on Dec. 17, 2013, which claims priority under 35 U.S.C. §119 of Chinese Application No. 201310432095.X filed on Sep. 22, 2013, the disclosure of which is incorporated by reference.

TECHNICAL FIELD OF THE DISCLOSURE

The present disclosure relates to the technical field of liquid crystal display, and particularly to a shift register unit and a gate driver circuit.

BACKGROUND

Drivers in a thin film transistor liquid crystal display (TFT-LCD) mainly comprise a gate driver circuit and a data driver circuit. The gate driver circuit converts an inputted clock signal through shift register units and then supplies the converted clock signal on gate lines of a liquid crystal display (LCD) panel. The gate driver circuit can be formed on the LCD panel together with TFTs in a same process. The gate driver circuit comprises a plurality of stages of shift register units, and each stage of shift register unit is connected to a corresponding gate line and outputs a gate driving signal. The respective stages of shift register units are connected each other, a start signal is input to the first stage of the respective stages, and gate driving signals are output to the gate lines sequentially. An input terminal of a present stage of shift register unit is connected to an output terminal of a previous stage of shift register unit, and an output terminal of a next stage of shift register unit is connected to a control terminal of the present stage of shift register unit.

The above structured gate driver circuit is set on the LCD panel. At present, in a gate driver circuit design, a pull-down node is generally arranged to pull down the potential at an output terminal of a shift register unit not corresponding to a row to which a gate driving signal is output. However, if the pull-down node is in a direct current (DC) high level operation state for a long time, it would cause drifts in threshold voltages of relevant thin film transistors, which has a disadvantageous effect on noise reduction. On the other hand, if the voltage signal at the pull-down node is a alternate current (AC) signal, effect caused by the drifts in the threshold voltages may be reduced, however output errors may occur and in turn reading and writing errors may be generated since there is a interval in the operation of pulling down with the alternate current signal.

SUMMARY

In order to solve the technical problem in the prior art, in embodiments of the present disclosure, there are provided a shift register unit and a gate driver circuit, which are configured to suppress output errors caused by the drifts in the threshold voltages and the interval existed in the operation of pulling down the output terminal, and thus to enhance the stability of the shift register unit.

The shift register unit provided in the embodiments of the present disclosure comprises: an input module connected to an input signal terminal and a first clock signal input terminal of the shift register unit and configured to provide an input signal to a pull-up node in response to the input signal and a first clock signal; a first output module connected to a second clock signal input terminal and configured to provide a second clock signal to a first output terminal of the shift register unit in response to a voltage signal at the pull-up node; a pull-down driving module connected to the first clock signal input terminal and the second clock signal input terminal, and configured to provide the first clock signal to a first pull-down node in response to the first clock signal, provide the second clock signal to a second pull-down node in response to the second clock signal, provide a first low voltage signal to the first pull-down node and the second pull-down node in response to the voltage signal at the pull-up node, provide the first low voltage signal to the second pull-down node in response to a voltage signal at the first pull-down node, and provide the first low voltage signal to the first pull-down node in response to a voltage signal at the second pull-down node; a pull-down module configured to provide the first low voltage signal to the pull-up node in response to the voltage signal at the first pull-down node and the voltage signal at the second pull-down node; a first output discharging unit configured to provide a second low voltage signal to the first output terminal of the shift register unit in response to the voltage signal at the first pull-down node and the voltage signal at the second pull-down node. The pull-up node is a connected point of the input module and the first output module, the first pull-down node and the second pull-down node are both connection points of the pull-down driving module and the pull-down module. The first low voltage signal is less than or equal to the second low voltage signal.

In the shift register unit, the pull-down driving module is connected to the first clock signal input terminal and the second clock signal input terminal, and is configured to provide the first clock signal to the first pull-down node in response to the first clock signal, provide the second clock signal to the second pull-down node in response to the second clock signal; provide the first low voltage signal to the first pull-down node and the second pull-down node in response to the voltage signal at the pull-up node; provide the first low voltage signal to the second pull-down node in response to the voltage signal at the first pull-down node; and provide the first low voltage signal to the first pull-down node in response to the voltage signal at the second pull-down node. Herein, the first pull-down node and the second pull-down node are both connection points of the pull-down driving module and the pull-down module. During a non-outputting phase, the voltage signal at the first pull-down node and the voltage signal at the second pull-down node are AC signals to effectively suppress the output errors caused by the drifts in the threshold voltages of elements, and thus the noise reduction effect is increased. Meanwhile, the voltage signal at the first pull-down node and the voltage signal at the second pull-down node are complementary, such that the first output discharging module always discharges the first output terminal during the non-outputting phase, thus removing the output errors caused by the time interval in which the first output terminal is not pulled down during the period in which the first output terminal should be pulled down.

Optionally, the input module comprises: a first thin film transistor (TFT) whose gate and source connected simultaneously to the input signal terminal of the shift register unit and drain connected to a source of a second TFT; and the second TFT whose gate connected to the first clock signal input terminal and drain connected to the pull-up node.

The input signal is provided to the pull-up node through the first TFT and the second TFT, so as to make the potential at the pull-up node increased.

Optionally, the first output module comprises: a third TFT whose gate connected to the pull-up node, drain connected to the second clock signal input terminal, and source connected to the first output terminal; and a capacitor connected between the pull-up node and the first output terminal.

When the pull-up node is at a high level, the third TFT is turned on, and then the second clock signal can be provided to the output terminal through the third TFT; the capacitor is configured to keep the potential at the pull-up node, such that the third TFT is kept turned on during a certain period.

Optionally, the pull-down driving module comprises: a fourth TFT whose gate and drain connected simultaneously to the first clock signal input terminal, and a source connected to the first pull-down node; a fifth TFT whose gate and source connected simultaneously to the second clock signal input terminal, and a drain connected to the second pull-down node; a sixth TFT whose gate connected to the pull-up node, drain connected to the first pull-down node, and source connected to a drain of a seventh TFT; the seventh TFT whose gate connected to the pull-up node and source connected to the first low voltage signal input terminal; an eighth TFT whose gate connected to the pull-up node, drain connected to the second pull-down node, and source connected to a drain of a ninth TFT; the ninth TFT whose gate connected to the pull-up node, and source connected to the first low voltage signal input terminal; a tenth TFT whose gate connected to the second pull-down node, drain connected to the first pull-down node, and source connected to the first low voltage signal input terminal; and an eleventh TFT whose gate connected to the first pull-down node, source connected to the second pull-down node, and drain connected to the first low voltage signal input terminal.

The pull-down driving module charges the first pull-down node through the fourth TFT, charges the second pull-down node through the fifth TFT, discharges the first pull-down node through the sixth TFT, the seventh TFT and the tenth TFT, and discharges the second pull-down node through the eighth TFT, the ninth TFT and the eleventh TFT. Since the potential at the first pull-down node and the potential at the second pull-down node are both AC signals during the non-outputting phase, the output errors caused by the drifts in the threshold voltages of the elements can be effectively suppressed, and thus the noise reduction effect can be increased. Since the voltage signal at the first pull-down node and the voltage signal at the second pull-down node are complementary, such that the first output discharging module always discharges the first output terminal during the non-outputting phase, thus removing the output errors caused by the interval existed in the operation of pulling down the first output terminal.

Optionally, the pull-down module comprises: a twelfth TFT whose gate connected to the first pull-down node, source connected to the pull-up node, and drain connected to a drain of a thirteenth TFT; the thirteenth TFT whose gate connected to the first pull-down node and drain connected to the first low voltage signal input terminal; a fourteenth TFT whose gate connected to the second pull-down node, source connected to the pull-up node, and drain connected to a source of a fifteenth TFT; the fifteenth TFT whose gate connected to the second pull-down node, and drain connected to the first low voltage signal input terminal.

The pull-down module discharges the pull-up node continuously in response to the voltage signal at the first pull-down node and the voltage signal at the second pull-down node, so as to remove the noise caused by the AC signals.

Optionally, the first output discharging module comprises: a sixteenth TFT whose gate connected to the first pull-down node, drain connected to the first output terminal, and source connected to the second low voltage signal input terminal; and a seventeenth TFT whose gate connected to the second pull-down node, drain connected to the first output terminal, and source connected to the second low voltage signal input terminal.

The first output discharging module discharges the first output terminal continuously during the non-outputting phase in response to the voltage signal at the first pull-down node and the voltage signal at the second pull-down node, thus removing the noise caused by the AC signals.

Optionally, the shift register unit further comprises: a second output module connected to the second clock signal input terminal and configured to provide the second clock signal to a second output terminal of the shift register unit in response to the voltage signal at the pull-up node to provide a reset signal for another shift register unit one-stage previous to the shift register unit.

Further, the second output module comprises: an eighteenth TFT whose gate connected to the pull-up node, drain connected to the second clock signal input terminal, and source connected to the second output terminal.

Optionally, the shift register unit further comprises: a second output discharging module configured to provide the second low voltage signal to the second output terminal in response to the voltage signal at the first pull-down node and the voltage signal at the second pull-down node.

The second output discharging module comprises: a nineteenth TFT whose gate connected to the first pull-down node, drain connected to the second output terminal, and source connected to the second low voltage signal input terminal; and a twentieth TFT whose gate connected to the second pull-down node, drain connected to the second output terminal, and source connected to the second low voltage signal input terminal.

The second output discharging module discharges the second output terminal continuously during the non-outputting phase in response to the voltage signal at the first pull-down node and the voltage signal at the second pull-down node, thus removing the noise caused by the AC signals.

Optionally, the shift register unit further comprises a third output module connected to the second clock signal input terminal and configured to provide the second clock signal to a third output terminal in response to the voltage signal at the pull-up node to provide a start signal for another shift register unit one-stage next to the shift register unit.

Further, the third output module comprises: a twenty-first TFT whose gate connected to the pull-up node, drain connected to the second clock signal input terminal, and source connected to the third output terminal.

Optionally, the shift register unit further comprises a third output discharging module configured to provide the first low voltage signal to the third output terminal in response to the voltage signal at the first pull-down node and the voltage signal at the second pull-down node.

The third output discharging module comprises: a twenty-second TFT whose gate connected to the first pull-down node, drain connected to the third output terminal, and source connected to the first low voltage signal input terminal; and a twenty-third TFT whose gate connected to the second pull-down node, drain connected to the third output terminal, and source connected to the first low voltage signal input terminal.

The third output discharging module discharges the third output terminal continuously during the non-outputting phase in response to the voltage signal at the first pull-down node and the voltage signal at the second pull-down node, thus removing the noise caused by the AC signals.

Optionally, the shift register unit further comprises a feedback module configured to provide the voltage signal at the second output terminal to the input module and the pull-down module in response to the voltage signal at the third output terminal.

Furthermore, the feedback module comprises: a twenty-fourth TFT whose gate connected to the third output terminal, drain connected simultaneously to the source of the second TFT, the drain of the twelfth TFT and the drain of the fourteenth TFT, and source connected to the second output terminal.

When the voltage signal in the feedback circuit is at a high level, the source of the second TFT, the source of the thirteenth TFT and the source of the fifteenth TFT are all at the high level, such that the second TFT T2, the thirteenth TFT T13 and the fifteenth TFT T15 are turned off, and meanwhile the first TFT, the twelfth TFT and the fourteenth TFT are completely turned off. Therefore, it can be effectively avoided that dark currents in the first TFT and the second TFT make the pull-up node discharged, dark currents in the twelfth TFT and the thirteenth TFT make the pull-up node discharged, and dark currents in the fourteenth TFT and the fifteenth TFT make the pull-up node discharged.

Optionally, the first low voltage signal is less than the second low voltage signal, and the potentials at the first pull-down node and the second pull-down node are less than the potential of the second low voltage when the potentials at the first pull-down node and the second pull-down node are both a low level, such that the transistors whose gates connected to the first pull-down node or the second pull-down node and sources connected to the second low voltage signal input terminal are more easily turned off, and the dark currents are effectively prevented from being generated.

The gate driver circuit provided in the embodiments in the present disclosure comprises respective stages of shift register units connected in cascade, the input signal terminal of a first stage of shift register unit is connected to a start signal terminal of the gate driver circuit, the reset signal terminal of the first stage of shift register unit is connected to any one of the output terminals of a second stage of shift register unit, the input signal terminal of a last stage of shift register unit is connected to any one of the output terminals of its previous stage of shift register unit, and the reset signal terminal of the last stage of shift register unit is connected to the start signal terminal. Except for the first stage and the last stage of shift register units, the input signal terminal of each of other stages of shift register units is connected to any one of the output terminals of its previous stage of shift register unit, and the reset signal terminal of each of other stages of shift register units is connected to any one of the output terminals of its next stage of shift register unit. All the shift register units connected in cascade are the above mentioned shift register unit.

DETAILED DESCRIPTION

In the embodiments of the present disclosure, there are provided a shift register unit and a gate driver circuit, which are configured to suppress output errors caused by the drifts in the threshold voltages and the time interval in which the output terminal is not pulled down during the period in which the output terminal should be pulled down, and thus to increase stability of the shift register unit.

Below, descriptions will be given to the embodiments of the present disclosure with reference to the accompanying drawings.

Figure 1:
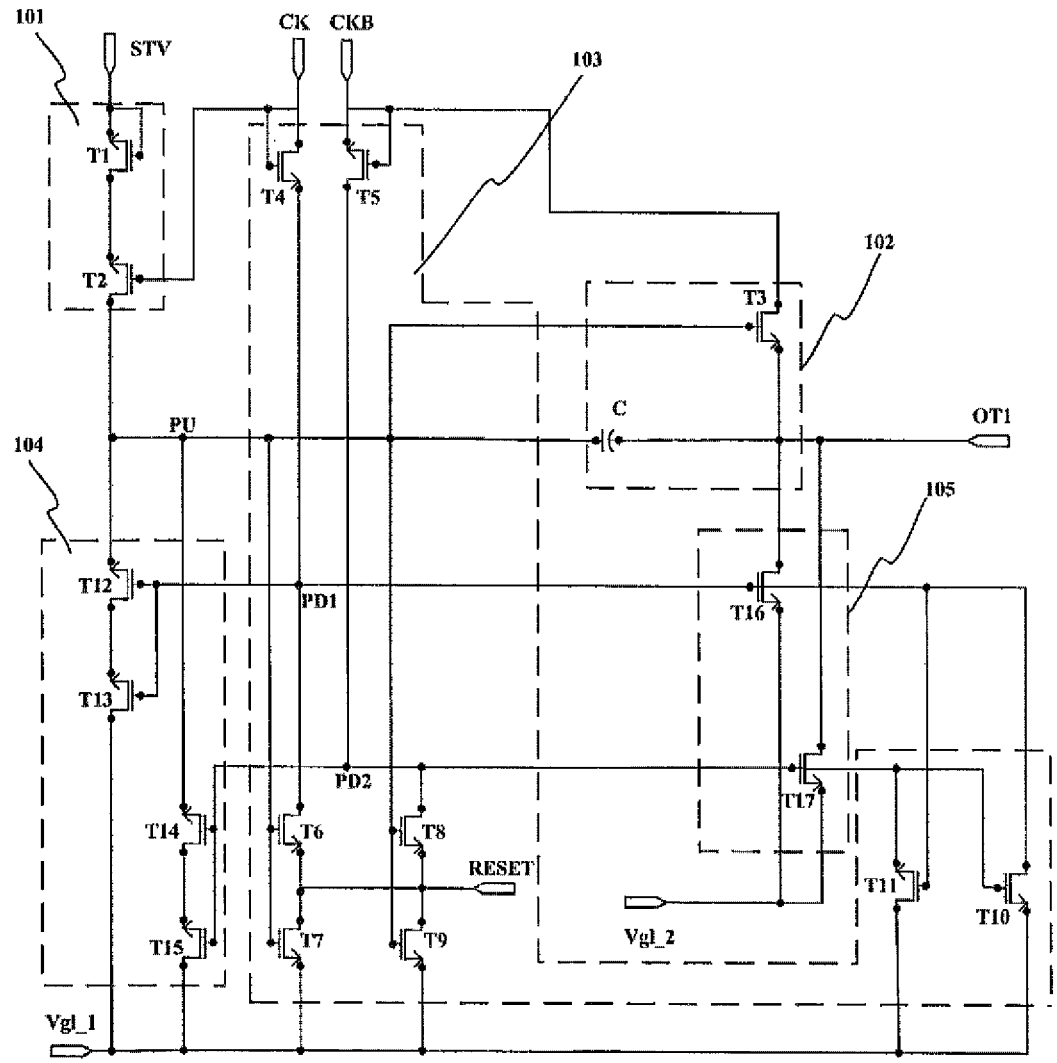
FIG. 1 is a schematic diagram of a structure of a shift register unit provided in a first embodiment of the present disclosure.

A shift register unit provided in a first embodiment of the present disclosure has a structure as shown in FIG. 1. It can be seen from FIG. 1 that the shift register unit comprises: an input module 101, a first output module 102, a pull-down driving module 103, a pull-down module 104 and a first output discharging module 105.

The input module 101 is connected to an input signal terminal and a first clock signal input terminal in the shift register unit, and is configured to provide an input signal to a pull-up node in response to the input signal and a first clock signal. The pull-up node is a connection point between the input module and the first output module.

The first output module 102 is connected to a second clock signal input terminal, and is configured to provide a second clock signal to a first output terminal in the shift register unit in response to a voltage signal at the pull-up node.

The pull-down driving module 103 is connected to the first clock signal input terminal and the second clock signal input terminal, is configured to: provide the first clock signal to a first pull-down node in response to the first clock signal and provide the second clock signal to a second pull-down node in response to the second clock signal; provide a first low voltage signal to the first pull-down node and the second pull-down node in response to the voltage signal at the pull-up node; provide the first low voltage signal to the second pull-down node in response to a voltage signal at the first pull-down node; and provide the first low voltage signal to the first pull-down node in response to a voltage signal at the second pull-down node. The first pull-down node and the second pull-down node are both connection points between the pull-down driving module and the pull-down module.

The pull-down module 104 is configured to provide the first low voltage signal to the pull-up node in response to the voltage signal at the first pull-down node and the voltage signal at the second pull-down node.

The first output discharging unit 105 is configured to provide a second low voltage signal to the first output terminal of the shift register unit in response to the voltage signal at the first pull-down node and the voltage signal at the second pull-down node.

In this embodiment, the first low voltage signal is less than or equal to the second low voltage signal, and the first low voltage signal and the second low voltage signal are both negative voltages so as to pull down the potentials at the nodes and/or output terminals connected thereto.

The operating principle of the present disclosure will be described in detail below with refer to specific embodiments. It should be noted that the embodiments are just for better explanations of the present disclosure and make no limitation on the present disclosure.

The shift register unit as shown in FIG. 1 comprises: an input module 101, a first output module 102, a pull-down driving module 103, a pull-down module 104 and a first output discharging module 105.

Specifically, the input module 101 comprises: a first thin film transistor (TFT) T1 whose gate and source connected to the input signal terminal INPUT of the shift register unit and drain connected to a source of a second TFT T2; and the second TFT T2 whose gate connected to the first clock signal CK input terminal and drain connected to the pull-up node PU.

The input signal is provided to the pull-up node PU through the first TFT T1 and the second TFT T2, so as to make the potential at the pull-up node PU increased.

The first output module 102 comprises: a third TFT T3 whose gate connected to the pull-up node PU, drain connected to the second clock signal CKB input terminal, and source connected to the first output terminal OT1; and a capacitor C connected between the pull-up node PU and the first output terminal OT1 and configured to keep the potential at the pull-up node PU, such that the third TFT T3 is kept turned on during a certain period.

The pull-down driving module 103 comprises: a fourth TFT T4 whose gate and drain connected to the first clock signal CK input terminal, and source connected to the first pull-down node PD1; a fifth TFT T5 whose gate and source simultaneously connected to the second clock signal CKB input terminal, and drain connected to the second pull-down node PD2; a sixth TFT T6 whose gate connected to the pull-up node PU, drain connected to the first pull-down node PD1, and source connected to a drain of a seventh TFT T7; the seventh TFT T7 whose gate connected to the pull-up node PU and source connected to the first low voltage signal Vg1_1 input terminal; an eighth TFT T8 whose gate connected to the pull-up node PU, drain connected to the second pull-down node PD2, and source connected to a drain of a ninth TFT T9; the ninth TFT T9 whose gate connected to the pull-up node PU, and source connected to the first low voltage signal Vg1_1 input terminal; a tenth TFT T10 whose gate connected to the second pull-down node PD2, drain connected to the first pull-down node PD1, and source connected to the first low voltage signal Vg1_1 input terminal; and an eleventh TFT T11 whose gate connected to the first pull-down node PD1, source connected to the second pull-down node PD2, and drain connected to the first low voltage signal Vg1_1 input terminal.

The pull-down driving module 103 charges the first pull-down node PD1 through the fourth TFT T4, charges the second pull-down node PD2 through the fifth TFT T5, discharges the first pull-down node PD1 through the sixth TFT T6, the seventh TFT T7 and the tenth TFT T10, and discharges the second pull-down node PD2 through the eighth TFT T8, the ninth TFT T9 and the eleventh TFT T11. Since the potential at the first pull-down node PD1 and the potential at the second pull-down node PD2 are AC signals during a non-outputting phase, the output errors caused by the drifts in the threshold voltages of the elements can be effectively suppressed, and thus the noise reduction effect can be increased. Since the voltage signal at the first pull-down node PD1 and the voltage signal at the second pull-down node PD2 are complementary, such that the first output discharging module 105 always discharges the first output terminal OT1 during the non-outputting phase, thus removing the output errors caused by the interval existed in the operation of pulling down the output terminal.

The pull-down module 104 comprises: a twelfth TFT T12 whose gate connected to the first pull-down node PD1, source connected to the pull-up node PU, and drain connected to a drain of a thirteenth TFT T13; the thirteenth TFT T13 whose gate connected to the first pull-down node PD1 and drain connected to the first low voltage signal Vg1_1 input terminal; a fourteenth TFT T14 whose gate connected to the second pull-down node PD2, source connected to the pull-up node PU, and drain connected to a source of a fifteenth TFT T15; the fifteenth TFT T15 whose gate connected to the second pull-down node PD2, and drain connected to the first low voltage signal Vg1_1 input terminal.

The pull-down module 104 discharges the pull-up node PU continuously in response to the voltage signal at the first pull-down node PD1 and the voltage signal at the second pull-down node PD2, so as to remove the noise caused by the AC signals.

The first output discharging module 105 comprises: a sixteenth TFT T16 whose gate connected to the first pull-down node PD1, drain connected to the first output terminal OT1, and source connected to the second low voltage signal Vg1_2 input terminal; and a seventeenth TFT T17 whose gate connected to the second pull-down node PD2, drain connected to the first output terminal OT1, and source connected to the second low voltage signal Vg1_2 input terminal.

The first output discharging module 105 discharges the first output terminal OT1 continuously during the non-outputting phase in response to the voltage signal at the first pull-down node PD1 and the voltage signal at the second pull-down node PD2, thus removing the noise caused by the AC signals.

In the shift register unit, the pull-down driving module 104 is connected to the first clock signal CK input terminal and the second clock signal CKB input terminal, is configured to: provide the first clock signal CK to the first pull-down node PD1 in response to the first clock signal CK and provide the second clock signal CKB to the second pull-down node PD2 in response to the second clock signal CKB; provide the first low voltage signal Vg1_1 to the first pull-down node PD1 and the second pull-down node PD2 in response to the voltage signal at the pull-up node PU; provide the first low voltage signal Vg1_1 to the second pull-down node PD2 in response to the voltage signal at the first pull-down node PD1; and provide the first low voltage signal Vg1_1 to the first pull-down node PD1 in response to the voltage signal at the second pull-down node PD2. During the non-outputting phase, the voltage signal at the first pull-down node PD1 and the voltage signal at the second pull-down node PD2 are both AC signals so as to effectively suppress the output errors caused by the drifts in the threshold voltages of elements. Meanwhile, the voltage signal at the first pull-down node PD1 and the voltage signal at the second pull-down node PD2 are complementary, such that the first output discharging module 105 always discharges the first output terminal OT1 during the non-outputting phase, thus removing the output errors caused by the interval existed in the operation of pulling down the first output terminal.

In the shift register unit, there is further a reset signal input terminal RESET connected simultaneously to the source of the sixth TFT T6 and the source of the eighth TFT T8. When a reset signal is at a high level, the sources of the sixth TFT T6 and the eighth TFT T8 are also at the high level, such that the sixth TFT T6 and the eighth TFT T8 are turned off quickly, thus preventing dark current from flowing through the sixth TFT T6 to discharge the first pull-down node PD1 while preventing dark current from flowing through the eighth TFT T8 to discharge the second pull-down node PD2.

The first low voltage signal Vg1_1 is less than the second low voltage signal Vg1_2, such that the sixteenth TFT T16 and the seventeenth TFT T17 are turned off more easily to effectively prevent dark currents from flowing through the sixteenth TFT T16 and the seventeenth TFT T17 to discharge the first output terminal an during an output phase.

Figure 2:
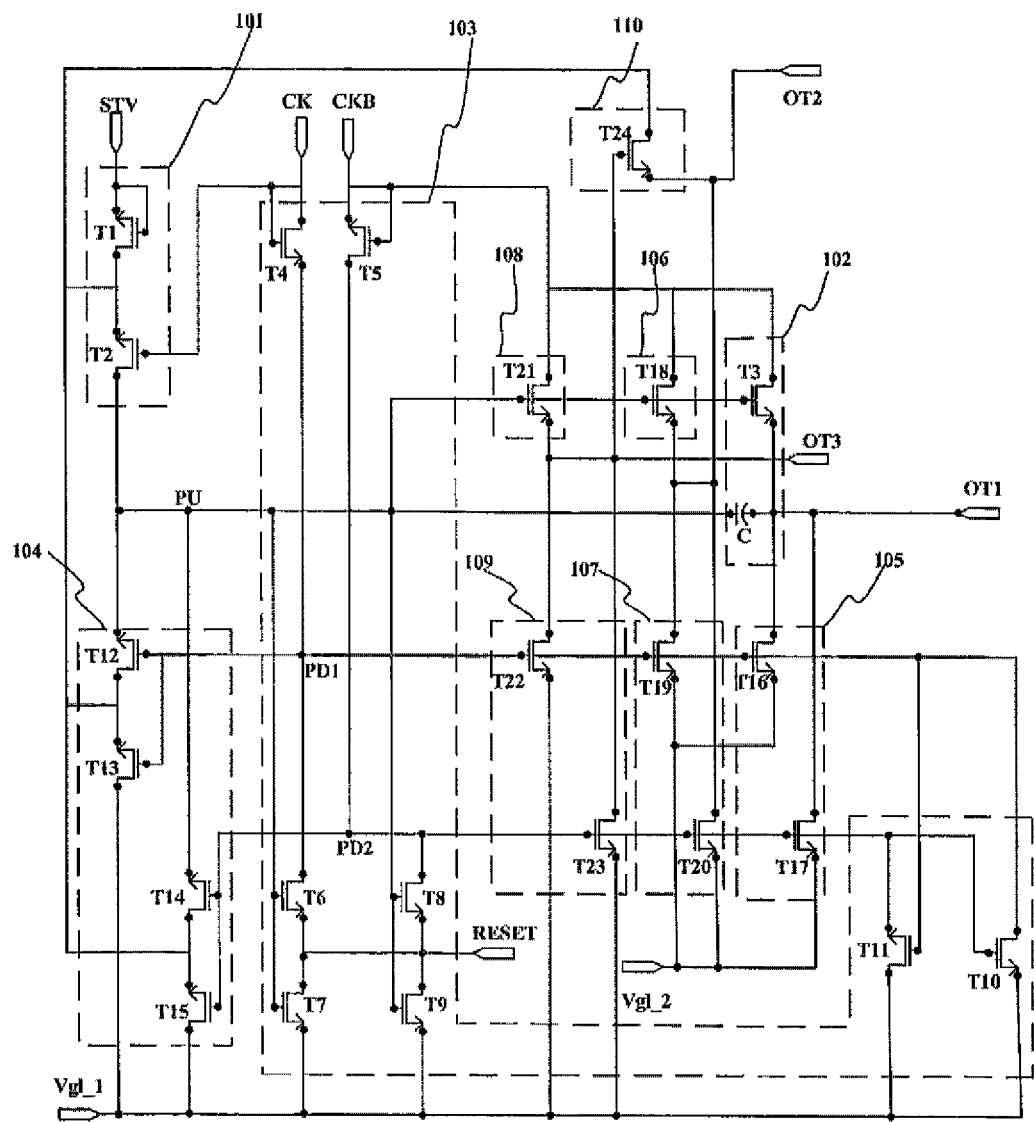
FIG. 2 is a schematic diagram of a structure of another shift register unit provided in a second embodiment of the present disclosure.

FIG. 2 shows a shift register unit provided in a second embodiment of the present disclosure. Referring to FIG. 2, the shift register unit shown therein not only comprises an input module 101, a first output module 102, a pull-down driving module 103, a pull-down module 104 and a first output discharging module 105, but also comprises a second output module 106, a second output discharging module 107, a third output module 108, a third output discharging module 109 and a feedback module 110.

In the second embodiment, the second output module 106 is connected to the second clock signal CKB input terminal, and is configured to provide the second clock signal CKB to a second output terminal OT2 in response to the voltage signal at the pull-up node PU so as to provide a reset signal for another shift register unit one-stage previous to the shift register unit.

Here, the second output module 106 comprises: an eighteenth TFT T18 whose gate connected to the pull-up node PU, drain connected to the second clock signal CKB input terminal, and source connected to the second output terminal OT2.

The second output discharging module 107 is configured to provide the second low voltage signal Vg1_2 to the second output terminal OT2 in response to the voltage signal at the first pull-down node PD1 and the voltage signal at the second pull-down node PD2.

Here, the second output discharging module 107 comprises: a nineteenth TFT T19 whose gate connected to the first pull-down node PD1, drain connected to the second output terminal OT2, and source connected to the second low voltage signal Vg1_2 input terminal; and a twentieth TFT T20 whose gate connected to the second pull-down node PD2, drain connected to the second output terminal OT2, and source connected to the second low voltage signal Vg1_2 input terminal.

The second output discharging module 107 discharges the second output terminal OT2 continuously during the non-outputting phase in response to the voltage signal at the first pull-down node PD1 and the voltage signal at the second pull-down node PD2, thus removing the noise caused by the AC signals.

The third output module 108 is connected to the second clock signal CKB input terminal, and is configured to provide the second clock signal CKB to a third output terminal OT3 in response to the voltage signal at the pull-up node PU so as to provide a start signal for another shift register unit one-stage next to the shift register unit.

Here, the third output module 108 comprises: a twenty-first TFT T21 whose gate connected to the pull-up node PU, drain connected to the second clock signal CKB input terminal, and source connected to the third output terminal OT3.

The third output discharging module 109 is configured to provide the first low voltage signal Vg1_1 to the third output terminal OT3 in response to the voltage signal at the first pull-down node PD1 and the voltage signal at the second pull-down node PD2, so as to provide a start signal for another shift register unit one-stage next to the shift register unit.

Here, the third output discharging module 109 comprises: a twenty-second TFT T22 whose gate connected to the first pull-down node PD1, drain connected to the third output terminal OT3, and source connected to the first low voltage signal Vg1_1 input terminal; and a twenty-third TFT T23 whose gate connected to the second pull-down node PD2, drain connected to the third output terminal OT3, and source connected to the first low voltage signal Vg1_1 input terminal.

The third output discharging module 109 discharges the third output terminal OT3 continuously during the non-outputting phase in response to the voltage signal at the first pull-down node PD1 and the voltage signal at the second pull-down node PD2, thus removing the noise caused by the AC signals.

The feedback module 110 is configured to provide the voltage signal at the second output terminal OT2 to the input module 101 and the pull-down module 104 in response to the voltage signal at the third output terminal OT3.

Here, the feedback module 110 comprises: a twenty-fourth TFT T24 whose gate connected to the third output terminal OT3, drain connected to the drain of the first TFT T1, the drain of the twelfth TFT T12 and the drain of the fourteenth TFT T14, and source connected to the second output terminal OT2.

When the output at the second output terminal OT2 is the high level, the source of the second TFT T2, the source of the thirteenth TFT T13 and the source of the fifteenth TFT T15 are all at the high level, such that the second TFT T2, the thirteenth TFT T13 and the fifteenth TFT T15 are all turned off, and at this time the first TFT T1, the twelfth TFT T12 and the fourteenth TFT T14 are also completely turned off, thus preventing dark currents from being generated in the second TFT T2, the twelfth TFT T12 and the fourteenth TFT T14 to discharge pull-up node PU.

It should be noted that the capacitor C can be set between the pull-up node PU and the first output terminal OT1, or can be set between the pull-up node PU and the second output terminal OT2, and can also be set between the pull-up node PU and the third output terminal OT3. In these three connection manners, the function of the capacitor is the same to keep the potential at the pull-up node PU.

In any one of the above mentioned TFTs, one electrode with an arrow is a source of the TFT, and the direction of the arrow is a current direction in the TFT.

In the shift register unit provided in the second embodiment of the present disclosure, an error in the output of a certain stage of shift register unit has no effect on the operation states of another shift register units one-stage pervious to the shift register unit and another shift register one-stage next to the shift register unit, since the reset signal and the start signal are output though separate circuits.

The above described shift register units are connected in cascade to form a gate driver circuit on array substrate. The gate driver circuit provided in the embodiments of the present disclosure comprises respective stages of shift register units connected in cascade, wherein the input signal terminal of a first stage of shift register unit is connected to a start signal terminal of the gate driver circuit, the reset signal terminal of the first stage of shift register unit is connected to any one of the output terminals of a second stage of shift register unit, the input signal terminal of a last stage of shift register unit is connected to any one of the output terminals of its previous stage of shift register unit, and the reset signal terminal of the last stage of shift register unit is connected to the start signal terminal. Except the first stage and the last stage of shift register units, the input signal terminal of each of other stages of shift register units is connected to any one of the output terminals of its previous stage of shift register unit, and the reset signal terminal of each of other stages of shift register units is connected to any one of the output terminals of its next stage of shift register unit. Each of the shift register units connected in cascade as above is the shift register unit as shown in FIG. 1 or the shift register unit as shown in FIG. 2.

Specifically, the gate driver circuit on array substrate comprises N stages of shift register units, wherein N is the number of gate lines, the start signal STV is input to the first stage of shift register unit as the input signal, and gate driving signals are output to respective gate lines sequentially, the input signal of a $n^{th}$ stage of shift register unit is supplied by the output signal of a $(n-1)^{th}$ stage of shift register unit, and the reset signal of the $n^{th}$ stage of shift register unit is supplied by the output signal of a $(n+1)^{th}$ stage of shift register unit, where n<N.

Figure 3:
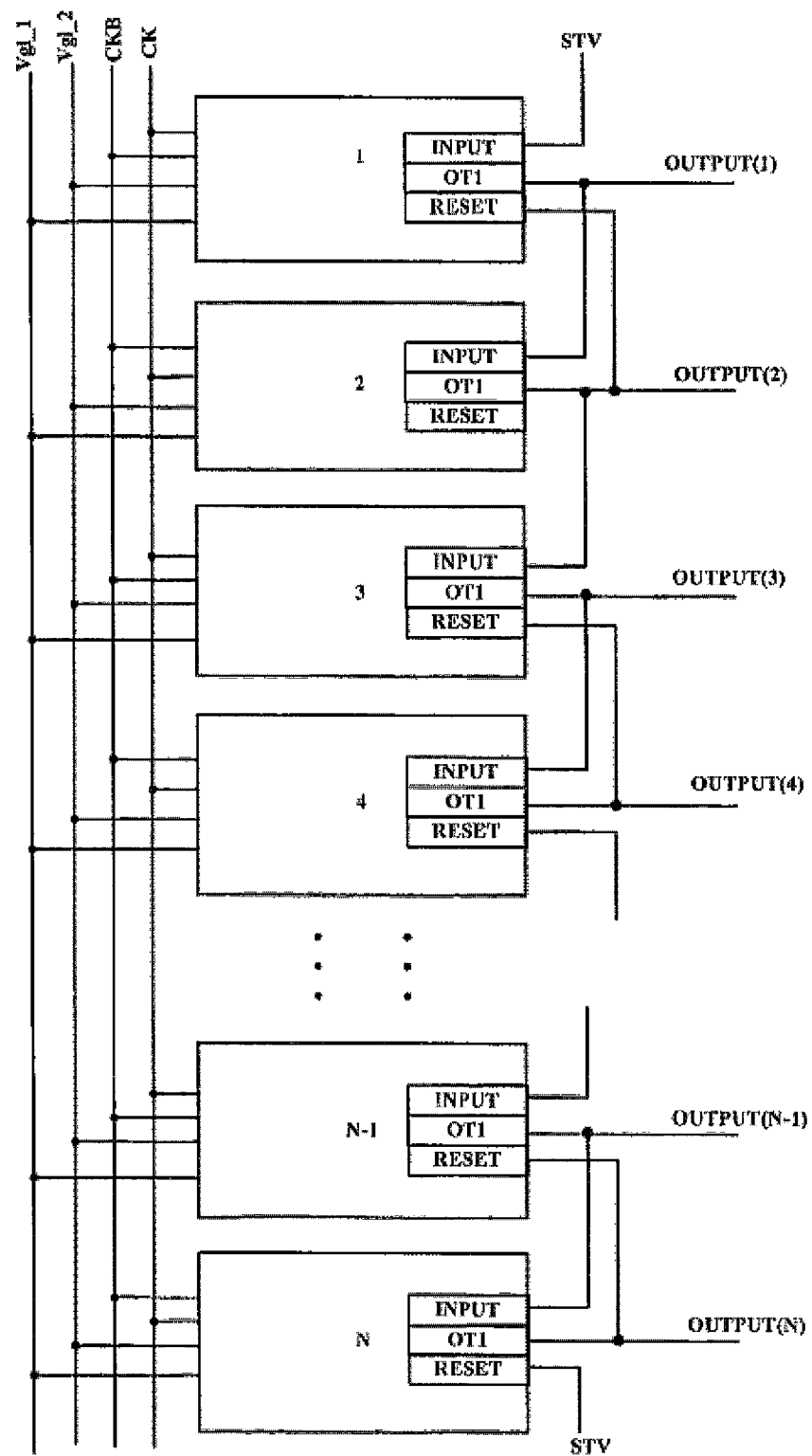
FIG. 3 is a schematic diagram of a structure of a gate driver circuit constituted by the shift register unit as shown in FIG. 1 provided in a third embodiment of the present disclosure.
Figure 4:
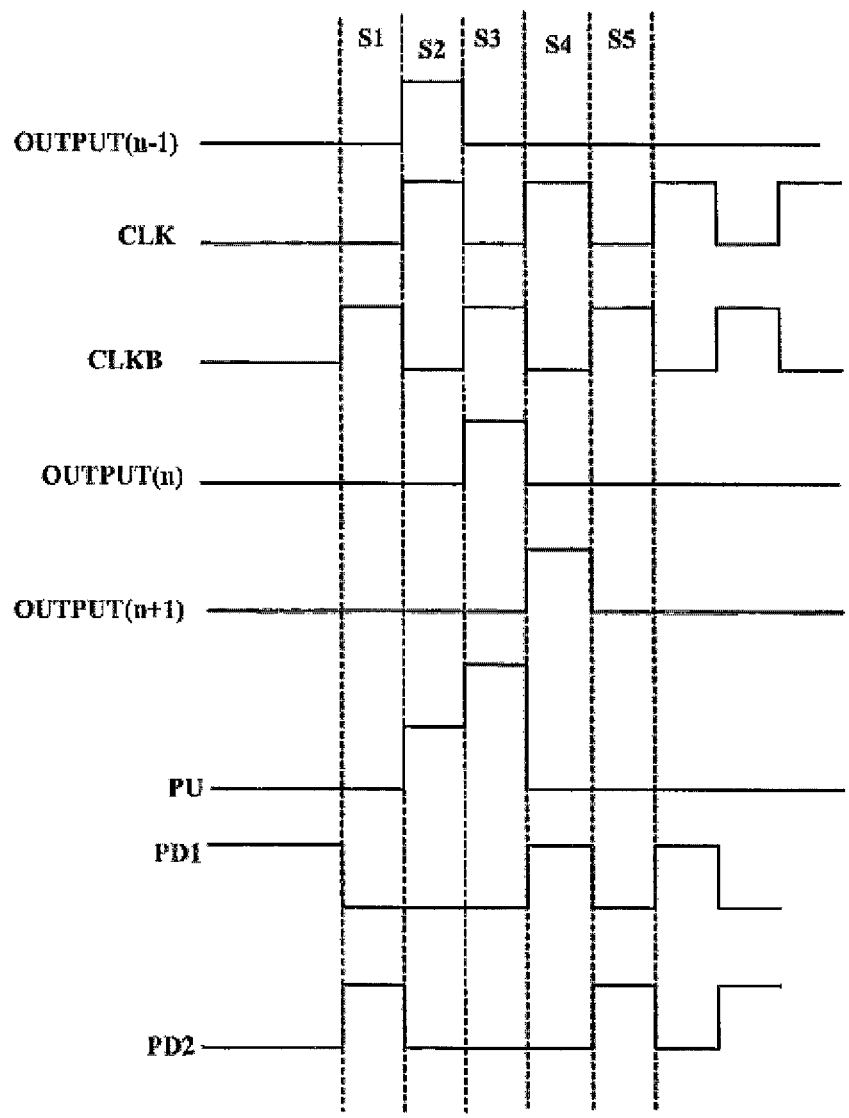
FIG. 4 is a timing diagram of signals at respective signal terminals in the shift register unit provided in the first embodiment of the present disclosure.

FIG. 3 shows a gate driver circuit on array substrate formed by the shift register units as shown in FIG. 1 connected in cascade as provided in a third embodiment of the present disclosure. FIG. 4 is a timing diagram of signals at respective signal terminals in the shift register unit. Below, the operating method of the $n^{th}$ stage of shift register unit in the gate driver circuit on array substrate as provided in the embodiment of the present disclosure will be described with reference to FIG. 4, where n<N and N is the number of stages of shift register units in the gate driver circuit on array substrate.

When the gate driver circuit performs the scanning operation, all of TFTs in the gate driver circuit are turned on at a high level, and are turned off at a low level. The first clock signal CK and the second clock signal CKB have phases opposites to each other.

During a first phase S1, the first clock signal CK is at the low level and the second clock signal CKB is at the high level, the output signal OUTPUT(n−1) of the $(n-1)^{th}$ stage of shift register unit being the input signal of the $n^{th}$ stage of shift register unit is at the low level, the output signal OUTPUT (n+1) of the $(n+1)^{th}$ stage of shift register unit being the reset signal of the $n^{th}$ stage of shift register unit is at the low level, the first pull-down node PD1 is at the low level, and the second pull-down node PD2 is at the high level.

The tenth TFT T10, the fourteenth TFT T14, the fifteenth TFT T15 and the seventeenth TFT T17 are turned on in response to the high level voltage signal at the second pull-down node PD2, the fourteenth TFT T14 and the fifteenth TFT T15 provide the first low voltage signal Vg1_1 to the pull-up node PU, the tenth TFT T10 provide the first low voltage signal Vg1_1 to the first pull-down node PD1, and the seventeenth TFT T17 provides the second low voltage signal Vg1_2 to the first output terminal OT1.

Therefore, the output signal OUTPUT(n) at the first output terminal OT1 is at the low level at this time.

During a second phase S2, the first clock signal CK is at the high level, the second clock signal CKB is at the low level, OUTPUT(n−1) is at the high level, and OUTPUT(n+1) is at the low level.

The first TFT T1 is turned on since the input signal OUTPUT(n−1) is at the high level, the second TFT T2 is turned on since the first clock signal CK is at the high level, the input signal charges the capacitor C through the first TFT T1 and the second TFT T2, and the pull-up node PU is at the high level. At this time, the third TFT T3 is turned on in response to the voltage signal at the pull-up node PU, but the output signal OUTPUT(n) at the first output terminal OT1 is at the low level since the second clock signal CKB is at the low level.

Meanwhile, the sixth TFT T6, the seventh TFT T7, the eighth TFT T8 and the ninth TFT T9 are turned on in response to the voltage signal at the pull-up node PU; the first pull-down node PD1 is discharged continuously through the sixth TFT T6 and the seventh TFT T7 and thus keeps at the low level; the second pull-down node PD2 is discharged through the eighth TFT T8 and the ninth TFT T9, and the potential at the second pull-down node PD2 is decreased rapidly.

During a third phase S3, the first clock signal CK is at the low level, the second clock signal CKB is at the high level, OUTPUT(n−1) is at the low level, and OUTPUT(n+1) is at the low level.

The first TFT T1 is turned off since the input signal OUTPUT(n−1) is at the low level, the second TFT T2 is turned off since the first clock signal CK is at the low level, but the pull-up node PU is kept at the high level due to the capacitor C. Meanwhile, the second clock signal CKB is at the high level, and the potential at the pull-up node PU is increased continuously due to the bootstrapping function of the capacitor C, such that the third TFT T3 is kept turned on.

Meanwhile, the sixth TFT T6, the seventh TFT T7, the eighth TFT T8 and the ninth TFT T9 are kept turned on in response to the voltage signal at the pull-up node PU, and the first pull-down node PD1 and the second pull-down node PD2 are at the low level. At this time, the sixteenth TFT T16 is turned off in response to the low level voltage signal at the first pull-down node PD1, and the seventeenth TFT T17 is turned off in response to the high level voltage signal at the second pull-down node PD2.

Therefore, the output signal OUTPUT(n) at the first output terminal OT1 is at the high level.

During a fourth phase S4, the first clock signal CK is at the high level, the second clock signal CKB is at the low level, OUTPUT(n−1) is at the low level, and OUTPUT(n+1) is at the high level.

The sixth TFT T6, the seventh TFT T7, the eighth TFT T8 and the ninth TFT T9 are completely turned off since OUTPUT(n+1) is at the high level. The fourth TFT T4 is turned on since the first clock signal CK is at the high level to provide the first clock signal CK to the first pull-down node PD1, the first pull-down node PD1 is increased to the high level. The eleventh TFT T11, the twelfth TFT T12, the thirteenth TFT T13 and the sixteenth TFT T16 are turned on in response to the high level voltage signal at the first pull-down node PD1, the twelfth TFT T12 and the thirteenth TFT T13 discharge the pull-up node PU, the pull-up node PU is decreased rapidly to the low level; the eleventh TFT T11 provides the first low voltage signal Vg1_1 to the second pull-down node PD2, the second pull-down node PD2 is kept at the low level; and the sixteenth TFT T16 provides the second low voltage signal Vg1_2 to the first output terminal OT1.

Therefore, the output signal OUTPUT(n) at the first output terminal OT1 is at the low level at this time.

During a fifth phase S5, the first clock signal CK is at the low level, the second clock signal CKB is at the high level, OUTPUT(n−1) is at the low level, and OUTPUT(n+1) is at the low level.

The fifth TFT T5 is turned on since the second clock signal CKB is at the high level, the eighth TFT T8 and the ninth TFT T9 are kept turned off in response to the voltage signal at the pull-up node PU, the second pull-down node PD2 is increased to the high level, the tenth TFT T10, the fourteenth TFT T14, the fifteenth TFT T15 and the seventeenth TFT T17 are turned on in response to the high level voltage signal at the second pull-down node PD2, the tenth TFT T10 provides the first low voltage signal Vg1_1 to the first pull-down node PD1, and the first pull-down node PD1 is kept at the low level; the fourteenth TFT T14 and the fifteenth TFT T15 discharges the pull-up node PU continuously, the pull-up node PU is kept at the low level and thus the third TFT T3 is turned off; meanwhile the seventeenth TFT T17 provides the second low voltage signal Vg1_2 to the first output terminal OT1.

Therefore, the output signal OUTPUT(n) at the first output terminal OT1 is at the low level.

Figure 5:
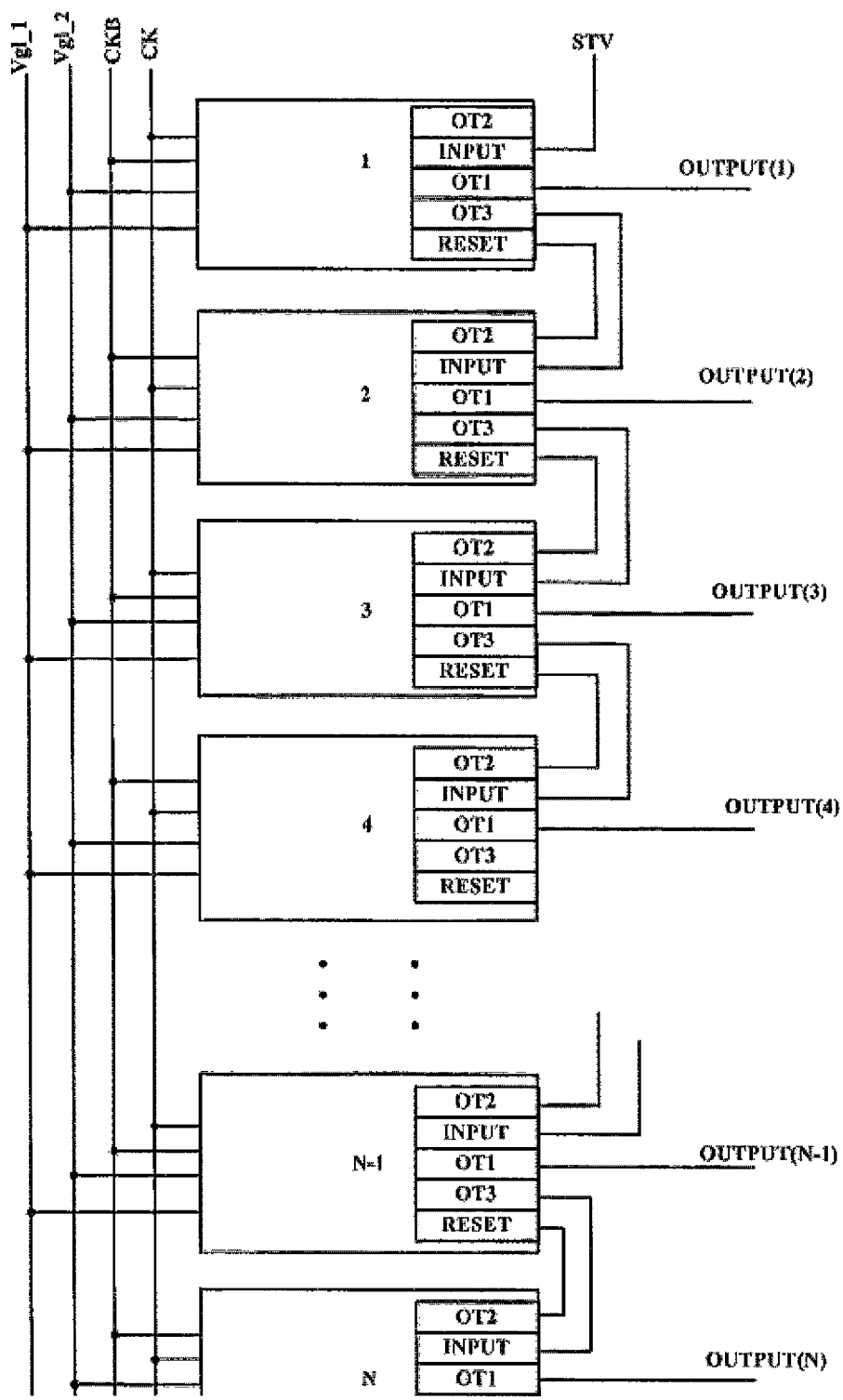
FIG. 5 is a schematic structure diagram of a structure of a gate driver circuit constituted by the shift register unit as shown in FIG. 1 provided in a fourth embodiment of the present disclosure.

FIG. 5 shows a gate driver circuit on array substrate constituted by the shift register unit as shown in FIG. 1 provided in a fourth embodiment of the present disclosure. With reference to FIG. 5, in the gate driver circuit, the first output terminal OT1(n) of the $n^{th}$ stage of shift register unit provides a signal for the present row, the second output terminal OT2(n) of the $n^{th}$ stage of shift register unit provides a reset signal to the $(n-1)^{th}$ stage of shift register unit, and the third output terminal OT3(n) of the $n^{th}$ stage of shift register unit provides a start signal to the $(n+1)^{th}$ stage of shift register unit. The first output terminal OT1(n), the second output terminal OT2(n) and the third output terminal OT3(n) have the same output signal, which is OUTPUT(n).

The operating method of the $n^{th}$ stage of shift register unit in the gate driver circuit on array substrate as provided in the fourth embodiment of the present disclosure will be described with reference to FIG. 4 below, where n<N and N is the number of stages of shift register units in the gate driver circuit on array substrate.

During a first phase S1, the first clock signal CK is at the low level and the second clock signal CKB is at the high level, the output signal OUTPUT(n−1) of the $(n-1)^{th}$ stage of shift register unit being the input signal of the $n^{th}$ stage of shift register unit is at the low level, the output signal OUTPUT(n+1) of the $(n+1)^{th}$ stage of shift register unit being the reset signal of the $n^{th}$ stage of shift register unit is at the low level, the first pull-down node PD1 is at the low level, and the second pull-down node PD2 is at the high level.

The tenth TFT T10, the fourteenth TFT T14, the fifteenth TFT T15 and the seventeenth TFT T17 are turned on in response to the high level voltage signal at the second pull-down node PD2. Herein, the tenth TFT T10 provide the first low voltage signal Vg1_1 to the first pull-down node PD1; the fourteenth TFT T14 and the fifteenth TFT T15 provide the first low voltage signal Vg1_1 to the pull-up node PU, the third TFT T3, the eighteenth TFT T18 and the twenty-first TFT T21 are turned off in response to the voltage signal at the pull-up node PU; and the seventeenth TFT T17 provides the second low voltage signal Vg1_2 to the first output terminal OT1(n), the twentieth TFT T20 provides the second low voltage signal Vg1_2 to the second output terminal OT2(n), and the twenty-third TFT T23 provides the first low voltage signal Vg1_1 to the third output terminal OT3(n).

Therefore, at this time, the output signal OUTPUT(n) at the first output terminal OT1(n), the output signal OUTPUT(n) at the second output terminal OT2(n) at the output signal OUTPUT(n) at the third output terminal OT3(n) are all at the low level.

During a second phase S2, the first clock signal CK is at the high level, the second clock signal CKB is at the low level, OUTPUT(n−1) is at the high level, and OUTPUT(n+1) is at the low level.

The first TFT T1 is turned on since the input signal OUTPUT(n−1) is at the high level, the second TFT T2 is turned on since the first clock signal CK is at the high level, the input signal charges the capacitor C through the first TFT T1 and the second TFT T2, such that the pull-up node PU is at the high level. At this time, the third TFT T3, the eighteenth TFT T18 and the twenty-first TFT T21 are turned on in response to the voltage signal at the pull-up node PU. However, at this time, the output signal OUTPUT(n) at the first output terminal OT1(n), the output signal OUTPUT(n) at the second output terminal OT2(n) and the output signal OUTPUT(n) at the third output terminal OT3(n) are all at the low level since the second clock signal CKB is at the low level.

Meanwhile, the sixth TFT T6, the seventh TFT T7, the eighth TFT T8 and the ninth TFT T9 are turned on in response to the voltage signal at the pull-up node PU; the first pull-down node PD1 is discharged continuously through the sixth TFT T6 and the seventh TFT T7 and thus keeps at the low level; the second pull-down node PD2 is discharged continuously through the eighth TFT T8 and the ninth TFT T9, such that the potential at the second pull-down node PD2 is decreased rapidly.

During a third phase S3, the first clock signal CK is at the low level, the second clock signal CKB is at the high level, OUTPUT(n−1) is at the low level, and OUTPUT(n+1) is at the low level.

The first TFT T1 is turned off since the input signal OUTPUT(n−1) is at the low level, the second TFT T2 is turned off since the first clock signal CK is at the low level, but the pull-up node PU is still kept at the high level due to the capacitor C. Meanwhile, the second clock signal CKB is at the high level, the potential at the pull-up node PU is increased continuously due to the bootstrapping function of the capacitor C, and the third TFT T3, the eighteenth TFT T18 and the twenty-first TFT T21 are kept turned on.

Meanwhile, the sixth TFT T6, the seventh TFT T7, the eighth TFT T8 and the ninth TFT T9 are kept turned on in response to the voltage signal at the pull-up node PU, and the first pull-down node PD1 and the second pull-down node PD2 are at the low level. At this time, the sixteenth TFT T16, the nineteenth TFT T19 and the twenty-second TFT T22 are turned off in response to the voltage signal at the first pull-down node PD1, and the seventeenth TFT T17, twentieth TFT T20 and the twenty-third TFT T23 are turned off in response to the voltage signal at the second pull-down node PD2.

Therefore, at this time, the output signal OUTPUT(n) at the first output terminal OT1(n), the output signal OUTPUT(n) at the second output terminal OT2(n) and the output signal OUTPUT(n) at the third output terminal OT3(n) are at the high level.

Meanwhile, the twenty-fourth TFT T24 is turned on in response to the voltage signal at the second output terminal OT2(n), such that the potential at the source of the second TFT T2, the potential at the drain of the twelfth TFT T12 and the potential at the drain of the fourteenth TFT T14 are increased, and thus the second TFT T2, the twelfth TFT T12 and the fourteenth TFT T14 are completely turned off so as to prevent the dark currents therein from discharging the pull-up node PU.

During a fourth phase S4, the first clock signal CK is at the high level, the second clock signal CKB is at the low level, OUTPUT(n−1) is at the low level, and OUTPUT(n+1) is at the high level.

The sixth TFT T6, the seventh TFT T7, the eighth TFT T8 and the ninth TFT T9 are turned off since OUTPUT(n+1) is at the high level. The fourth TFT T4 is turned on since the first clock signal CK is at the high level to provide the first clock signal CK to the first pull-down node PD1, the first pull-down node PD1 is increased to the high level. The eleventh TFT T11, the twelfth TFT T12, the thirteenth TFT T13, the sixteenth TFT T16, the nineteenth TFT T19 and the twenty-second TFT T22 are turned on in response to the voltage signal at the first pull-down node PD1, the twelfth TFT T12 and the thirteenth TFT T13 discharge the pull-up node PU, and the pull-up node PU is decreased rapidly to the low level; the eleventh TFT T11 provides the first low voltage signal Vg1_1 to the second pull-down node PD2, and the second pull-down node PD2 is kept at the low level; and the sixteenth TFT T16 provides the second low voltage signal Vg1_2 to the first output terminal OT1(n), the nineteenth TFT T19 provides the second low voltage signal Vg1_2 to the second output terminal OT2(n), and the twenty-second TFT T22 provides the first low voltage signal Vg1_1 to the third output terminal OT3(n).

Therefore, at this time, the output signal OUTPUT(n) at the first output terminal OT1(n), the output signal OUTPUT(n) at the second output terminal OT2(n) and the output signal OUTPUT(n) at the third output terminal OT3(n) are at the low level.

During a fifth phase S5, the first clock signal CK is at the low level, the second clock signal CKB is at the high level, OUTPUT(n−1) is at the low level, and OUTPUT(n+1) is at the high level.

The fifth TFT T5 is turned on since the second clock signal CKB is at the high level, the eighth TFT T8 and the ninth TFT T9 are kept turned off in response to the voltage signal at the pull-up node PU, and the second pull-down node PD2 is increased to the high level. The tenth TFT T10, the fourteenth TFT T14, the fifteenth TFT T15, the seventeenth TFT T17, the twentieth TFT T20 and the twenty-third TFT T23 are turned on in response to the voltage signal at the second pull-down node PD2, the tenth TFT T10 provides the first low voltage signal Vg1_1 to the first pull-down node PD1, and the first pull-down node PD1 is kept at the low level; the fourteenth TFT T14 and the fifteenth TFT T15 discharges the pull-up node PU continuously, and the pull-up node PU is kept at the low level and thus the third TFT T3, the eighteenth TFT T18 and the twenty-first TFT T21 are turned off; the seventeenth TFT T17 provides the second low voltage signal Vg1_2 to first output terminal OT1(n), the twentieth TFT T20 provides the second low voltage signal Vg1_2 to the second output terminal OT2(n), and the twenty-third TFT T23 provides the first low voltage signal Vg1_1 to the third output terminal OT3(n).

Therefore, at this time, the output signal OUTPUT(n) at the first output terminal OT1(n), the output signal OUTPUT(n) at the second output terminal OT2(n) and the output signal OUTPUT(n) at the third output terminal OT3(n) are all at the low level.

To sum up, in the shift register unit in the embodiments of the present disclosure, the pull-down driving module is connected to the first clock signal input terminal and the second clock signal input terminal, is configured to: provide the first clock signal to the first pull-down node in response to the first clock signal and provide the second clock signal to the second pull-down node in response to the second clock signal; provide the first low voltage signal to the first pull-down node and the second pull-down node in response to the voltage signal at the pull-up node; provide the first low voltage signal to the second pull-down node in response to the voltage signal at the first pull-down node; and provide the first low voltage signal to the first pull-down node in response to the voltage signal at the second pull-down node. Herein, the first pull-down node and the second pull-down node are connection points between the pull-down driving module and the pull-down module. During a non-outputting phase, the voltage signal at the first pull-down node and the voltage signal at the second pull-down node are AC signals to effectively suppress the output errors caused by the drifts in the threshold voltages of elements. Meanwhile, the voltage signal at the first pull-down node and the voltage signal at the second pull-down node are complementary, such that the first output discharging module always discharges the first output terminal during the non-outputting phase, thus removing the output errors caused by the interval existed in the operation of pulling down the first output terminal.

It will be obvious that those skilled in the art can make modifications and variations to the above embodiments without departing the spirit and scope of the present disclosure as defined by the following claims. Such variations and modifications are intended to be comprised within the spirit and scope of the present disclosure.

What is claimed is:

1. A shift register unit comprising an input module, a first output module, a pull-down driving module, a pull-down module and a first output discharging unit,
    wherein the input module is connected to an input signal terminal and a first clock signal input terminal of the shift register unit and configured to provide an input signal to a pull-up node in response to the input signal and a first clock signal, the pull-up node being the connection point of the input module and the first output module;
    the first output module is connected to a second clock signal input terminal and configured to provide a second clock signal to a first output terminal of the shift register unit in response to a voltage signal at the pull-up node;
    the pull-down driving module is connected to the first clock signal input terminal and the second clock signal input terminal, and configured to provide the first clock signal to a first pull-down node in response to the first clock signal, provide the second clock signal to a second pull-down node in response to the second clock signal, provide a first low voltage signal to the first pull-down node and the second pull-down node in response to the voltage signal at the pull-up node, provide the first low voltage signal to the second pull-down node in response to a voltage signal at the first pull-down node, and provide the first low voltage signal to the first pull-down node in response to a voltage signal at the second pull-down node, the first pull-down node and the second pull-down node being both connection points of the pull-down driving module and the pull-down module;
    the pull-down module is configured to provide the first low voltage signal to the pull-up node in response to the voltage signal at the first pull-down node and the voltage signal at the second pull-down node;
    the first output discharging unit is configured to provide a second low voltage signal to the first output terminal of the shift register unit in response to the voltage signal at the first pull-down node and the voltage signal at the second pull-down node;
    wherein the first low voltage signal is less than or equal to the second low voltage signal, and
    the shift register further comprises a second output module connected to the second clock signal input terminal and configured to provide the second clock signal to a second output terminal of the shift register unit in response to the voltage signal at the pull-up node to provide a reset signal for another shift register unit one-stage previous to the shift register unit.

2. The shift register unit of claim 1, wherein the input module comprises:
    a first thin film transistor TFT whose gate and source are connected simultaneously to the input signal terminal of the shift register unit, and whose drain is connected to a source of a second TFT; and
    the second TFT whose gate is connected to the first clock signal and whose drain is connected to the pull-up node.

3. The shift register unit of claim 1, wherein the first output module comprises:

a third TFT whose gate is connected to the pull-up node, whose drain is connected to the second clock signal input terminal, and whose source connected to the first output terminal; and a capacitor connected between the pull-up node and the first output terminal.

4. The shift register unit of claim 1, wherein the pull-down driving module comprises:

a fourth TFT whose gate and drain are connected simultaneously to the first clock signal input terminal, and whose source is connected to the first pull-down node;

a fifth TFT whose gate and source are connected simultaneously to the second clock signal input terminal, and whose drain is connected to the second pull-down node;

a sixth TFT whose gate is connected to the pull-up node, whose drain is connected to the first pull-down node, and whose source is connected to a drain of a seventh TFT;

the seventh TFT whose gate is connected to the pull-up node and whose source is connected to the first low voltage signal input terminal;

an eighth TFT whose gate is connected to the pull-up node, whose drain is connected to the second pull-down node, and whose source is connected to a drain of a ninth TFT;

the ninth TFT whose gate is connected to the pull-up node, and whose source is connected to the first low voltage signal input terminal;

a tenth TFT whose gate is connected to the second pull-down node, whose drain is connected to the first pull-down node, and whose source is connected to the first low voltage signal input terminal; and an eleventh TFT whose gate is connected to the first pull-down node, whose source is connected to the second pull-down node, and whose drain is connected to the first low voltage signal input terminal.

5. The shift register unit of claim 1, wherein the pull-down module comprises:

a twelfth TFT whose gate is connected to the first pull-down node, whose source is connected to the pull-up node, and whose drain is connected to a drain of a thirteenth TFT;

the thirteenth TFT whose gate is connected to the first pull-down node and whose drain is connected to the first low voltage signal input terminal;

a fourteenth TFT whose gate is connected to the second pull-down node, whose source is connected to the pull-up node, and whose drain is connected to a source of a fifteenth TFT; and the fifteenth TFT whose gate is connected to the second pull-down node, and whose drain is connected to the first low voltage signal input terminal.

6. The shift register unit of claim 1, wherein the first output discharging module comprises:

a sixteenth TFT whose gate is connected to the first pull-down node, whose drain is connected to the first output terminal, and whose source is connected to the second low voltage signal input terminal; and a seventeenth TFT whose gate is connected to the second pull-down node, whose drain is connected to the first output terminal, and whose source is connected to the second low voltage signal input terminal.

7. The shift register unit of claim 1, wherein the second output module comprises:

an eighteenth TFT whose gate is connected to the pull-up node, whose drain is connected to the second clock signal input terminal, and whose source is connected to the second output terminal.

8. The shift register unit of claim 7, further comprising: a second output discharging module configured to provide the second low voltage signal to the second output terminal in response to the voltage signal at the first pull-down node and the voltage signal at the second pull-down node.

9. The shift register unit of claim 8, wherein the second output discharging module comprises:

a nineteenth TFT whose gate is connected to the first pull-down node, whose drain is connected to the second output terminal, and whose source is connected to the second low voltage signal input terminal; and a twentieth TFT whose gate is connected to the second pull-down node, whose drain is connected to the second output terminal, and whose source is connected to the second low voltage signal input terminal.

10. The shift register unit of claim 1, further comprising a third output module connected to the second clock signal input terminal and configured to provide the second clock signal to a third output terminal in response to the voltage signal at the pull-up node to provide a start signal for another shift register unit one-stage next to the shift register unit.

11. The shift register unit of claim 10, wherein the third output module comprises:

a twenty-first TFT whose gate is connected to the pull-up node, whose drain is connected to the second clock signal input terminal, and whose source is connected to the third output terminal.

12. The shift register unit of claim 11, further comprising a third output discharging module configured to provide the first low voltage signal to the third output terminal in response to the voltage signal at the first pull-down node and the voltage signal at the second pull-down node.

13. The shift register unit of claim 12, wherein the third output discharging module comprises:

a twenty-second TFT whose gate is connected to the first pull-down node, whose drain is connected to the third output terminal, and whose source is connected to the first low voltage signal input terminal; and a twenty-third TFT whose gate is connected to the second pull-down node, whose drain is connected to the third output terminal, and whose source is connected to the first low voltage signal input terminal.

14. The shift register unit of claim 10, further comprising a feedback module configured to provide the voltage signal at the second output terminal to the input module and the pull-down module in response to the voltage signal at the third output terminal.

15. The shift register unit of claim 14, wherein the feedback module comprises: a twenty-fourth TFT whose gate is connected to the third output terminal, whose drain is connected simultaneously to the source of the second TFT, the drain of the twelfth TFT and the drain of the fourteenth TFT, and whose source is connected to the second output terminal.

16. A gate driver circuit comprising respective stages of shift register units connected in cascade, wherein the input signal terminal of a first-stage shift register unit is connected to a start signal terminal of the gate driver circuit, the reset signal terminal of the first-stage shift register unit is connected to any one of the output terminals of a second-stage shift register unit, the input signal terminal of a last-stage shift register unit is connected to any one of the output terminals of its previous-stage shift register unit, and the reset signal terminal of the last-stage shift register unit is connected to the start signal terminal, except for the first-stage and the last-stage shift register units, the input signal terminal of each of the other stages of the shift register units is connected to any one of the output terminals of its previous-stage shift register unit, and the reset signal terminal of each of the other stages of the shift register units is connected to any one of the output terminals of its next-stage shift register unit, wherein all the shift register units connected in cascade are the shift register units of claim 1.

17. The gate driver circuit of claim 16, wherein the input module comprises:
   a first thin film transistor TFT whose gate and source are connected simultaneously to the input signal terminal of the shift register unit, and whose drain is connected to a source of a second TFT; and
   the second TFT whose gate is connected to the first clock signal input terminal and whose drain is connected to the pull-up node.

18. The gate driver circuit of claim 16, wherein the first output module comprises:
   a third TFT whose gate is connected to the pull-up node, whose drain is connected to the second clock signal input terminal, and whose source is connected to the first output terminal; and
   a capacitor connected between the pull-up node and the first output terminal.

19. The gate driver circuit of claim 16, wherein the pull-down driving module comprises:
   a fourth TFT whose gate and drain are connected simultaneously to the first clock signal input terminal, and whose source is connected to the first pull-down node;
   a fifth TFT whose gate and source are connected simultaneously to the second clock signal input terminal, and whose drain is connected to the second pull-down node;
   a sixth TFT whose gate is connected to the pull-up node, whose drain is connected to the first pull-down node, and whose source is connected to a drain of a seventh TFT;
   the seventh TFT whose gate is connected to the pull-up node and whose source is connected to the first low voltage signal input terminal;
   an eighth TFT whose gate is connected to the pull-up node, whose drain is connected to the second pull-down node, and whose source is connected to a drain of a ninth TFT;
   the ninth TFT whose gate is connected to the pull-up node, and whose source is connected to the first low voltage signal input terminal;
   a tenth TFT whose gate is connected to the second pull-down node, whose drain is connected to the first pull-down node, and whose source is connected to the first low voltage signal input terminal; and
   an eleventh TFT whose gate is connected to the first pull-down node, whose source is connected to the second pull-down node, and whose drain is connected to the first low voltage signal input terminal.

* * * * *